US007902683B2

(12) United States Patent
Pueschner et al.

(10) Patent No.: US 7,902,683 B2
(45) Date of Patent: Mar. 8, 2011

(54) SEMICONDUCTOR ARRANGEMENT AND METHOD FOR PRODUCING A SEMICONDUCTOR ARRANGEMENT

(75) Inventors: Frank Pueschner, Kelheim (DE); Erik Heinemann, Regensburg (DE); Stephan Janka, Regensburg (DE)

(73) Assignee: Infineon Technologies AG (DE)

( * ) Notice: Subject to any disclaimer, the term of this patent is extended or adjusted under 35 U.S.C. 154(b) by 777 days.

(21) Appl. No.: 11/388,327

(22) Filed: Mar. 23, 2006

(65) Prior Publication Data

US 2006/0278958 A1 Dec. 14, 2006

(30) Foreign Application Priority Data

Mar. 23, 2005 (DE) ........................ 10 2005 013 500

(51) Int. Cl.
*H01L 23/06* (2006.01)

(52) U.S. Cl. ................. 257/784; 257/690; 257/E21.001; 257/E23.167

(58) Field of Classification Search .......... 257/678–733, 257/E21.001, E23.167
See application file for complete search history.

(56) References Cited

U.S. PATENT DOCUMENTS

| | | | | |
|---|---|---|---|---|
| 5,742,094 | A | 4/1998 | Ting | |
| 6,174,751 | B1 | 1/2001 | Oka et al. | |
| 6,441,487 | B2 | 8/2002 | Elenius et al. | |
| 6,763,994 | B2 * | 7/2004 | Hashimoto | 228/123.1 |
| 2001/0039078 | A1 | 11/2001 | Schroen | |
| 2004/0241906 | A1 * | 12/2004 | Chan | 438/107 |
| 2005/0032353 | A1 | 2/2005 | Cheng et al. | |
| 2005/0230794 | A1 | 10/2005 | Shizuno | |
| 2006/0246626 | A1 * | 11/2006 | Jiang et al. | 438/114 |

FOREIGN PATENT DOCUMENTS

EP 1 150 552 A2 10/2001

OTHER PUBLICATIONS

Imamura, Yoichi “Electrode Periphery Structrure of Semiconductor Device” Feb. 25, 1991, JP 03044046 Schreiber Tanslations.*

Sugawara et al. “Semconductor Device” Feb. 18, 1985, JP 60031244 Tanslation FLS Inc.*

* cited by examiner

*Primary Examiner* — Mary Wilczewski
*Assistant Examiner* — Telly D Green
(74) *Attorney, Agent, or Firm* — Dickstein Shapiro LLP

(57) ABSTRACT

A semiconductor arrangement having at least one semiconductor chip, which has, on one surface, an integrated circuit and at least one contact element which is electrically conductively connected to the latter, and having an edge protector, which at least partially covers an edge region on the surface of the semiconductor, the edge region extending along outer edges of the semiconductor chip. A method for manufacturing the above-mentioned semiconductor arrangement.

23 Claims, 3 Drawing Sheets

SEMICONDUCTOR ARRANGEMENT AND METHOD FOR PRODUCING A SEMICONDUCTOR ARRANGEMENT

CROSS-REFERENCE TO RELATED APPLICATIONS

This application claims priority to German Patent Application Serial No. 102005013500.5, which was filed on Mar. 23, 2005, and is herein incorporated by reference in its entirety.

BACKGROUND OF THE INVENTION

Semiconductor chips are used in a very wide variety of ways. In this case, they have, if it is not an individual component, for example a transistor, a more or less complex integrated circuit on their surface. In principle, the invention described later is independent of the complexity of the integrated circuit, with the result that a semiconductor chip having an individual component, for example a transistor, may also ultimately be involved below. However, for the purpose of simplification, an integrated circuit on one surface of the semiconductor chip will be assumed below. However, this is not intended to exclude the fact that it could also be an individual component.

In the past, the semiconductor chip was placed in a housing, for which purpose that side of the semiconductor chip which faced away from the integrated circuit was frequently placed on a carrier, and contacts, which are part of the integrated circuit, were connected, for example by means of wire bonding connections, to contacts of the carrier which are used as connections of the housed component. However, a housed component of this type is not suitable in some areas. For many years, integrated circuits have been produced on semiconductor chips which are arranged in plastic carriers in the form of cards. In this respect, mention may be made, by way of example, of the so-called "SIM" card which is intended for use in a so-called mobile phone or else the health insurance card which is widely used at least in Germany. In applications of this type, it is understandable that, in the case of the desired minimal thicknesses, a conventional housing is not provided. For this reason, it has been known practice, for a long time, to produce a so-called chip module which comprises, for example, a plastic carrier which has the "ISO" contacts which are known from the "SIM" card on one side, for example. In the case of the known arrangements, that side of the semiconductor chip which faces away from the area in which the integrated circuit is formed is placed and fastened on that side of the carrier which is opposite the contacts. The contacts on the semiconductor chip which are connected to the integrated circuit are electrically conductively produced, by means of a wire bonding connection, to form pads on the carrier, which are, in turn, connected to the abovementioned contact areas. These wire bonding connections are sensitive and were therefore frequently covered. As can be discerned, a procedure of this type has a large number of production steps which, in turn, contradict the usual obligation to produce chip modules of this type in a cost-effective manner. For the purpose of simplification, it has likewise become known practice in the meantime to produce chip modules of this type such that the semiconductor chip is electrically conductively placed on the carrier and connected using so-called flip-chip technology. To this end, contact elements, so-called "bumps", are first of all produced on the surface of the semiconductor chip, said contact elements being intended to produce an electrically conductive connection between the contact areas of the integrated circuit and corresponding contact areas on the substrate. In order to ensure this, a soldered connection to these bumps is produced.

An arrangement of this type is illustrated, by way of example, in FIG. 5. A semiconductor chip 1 has an integrated circuit 1*a* in the region of its surface 2. Said integrated circuit is covered by a chip passivation 4, the chip passivation 4 having bushings through which contact elements 3 for contact-connecting the integrated circuit 1*a* are formed. In order to form these contact elements 3, contact areas (not illustrated) of the integrated circuit 1*a* are provided with a metallic layer on the surface 2. In this case, a nickel layer which is deposited on the outside without using electric current is preferably applied. This process causes all of the metal areas on the chip to be coated with nickel. Since metal areas are usually situated in the edge region of the semiconductor chip, the so-called scribing frame or sawing frame, they are also coated with nickel. Coating of this type is undesirable. It can also be seen in FIG. 5 that the contact elements 3 of the semiconductor chip 1 are arranged on a substrate or carrier 9. The latter has conductor structures on the side 10 facing the semiconductor chip 1 and is, overall, in the form of a so-called "leadframe". When the semiconductor chip 1 is being placed on the substrate 9 and the contact elements 3 are being soldered to contact areas opposite, the substrate 9 is regularly bent, with the result that its surface 10 comes to rest on the surface 2 of the semiconductor chip 1. From time to time, this results in disturbances, for example leakage currents or short circuits.

BRIEF SUMMARY OF THE INVENTION

A semiconductor arrangement and method for producing the semiconductor arrangement, the semiconductor arrangement having at least one semiconductor chip, which has, on one surface, an integrated circuit and at least one contact element that is electrically connected to the integrated circuit, and having an edge protector, which at least partially covers an edge region on the surface of the semiconductor chip, the edge region extending along outer edges of the semiconductor chip.

DETAILED DESCRIPTION OF THE INVENTION

The invention is based on an object of providing a semiconductor arrangement and a method for producing a semiconductor arrangement of this type, which eliminates the risk of short circuits being produced in the edge region of the semiconductor chip when the semiconductor chip and a substrate are brought together.

Provision is made of a semiconductor arrangement having at least one semiconductor chip, which has, on one surface, an integrated circuit and at least one contact element which is electrically conductively connected to the latter, and having edge protection, which at least partially covers an edge region on the surface, the edge region extending along outer edges of the semiconductor chip.

Provision is also made of a semiconductor arrangement having a semiconductor chip which has an integrated circuit on one surface, having a contact element which is arranged on the one surface and is connected to a substrate that comprises a flexible material, and having edge protection which is formed on the surface of the semiconductor chip in such a manner that the substrate on an outer edge of the semiconductor chip comes to rest on the edge protection in the event of bending.

Provision is also made of a method for producing a semiconductor arrangement, in which an integrated circuit is formed on one surface of a semiconductor chip, a metallic layer which comprises a plurality of partial regions and does not completely cover the surface of the semiconductor chip is applied to the surface, a layer having at least one opening is then applied, a contact element which projects beyond the passivation layer and is electrically conductively connected to one of the partial regions is formed through the opening, and edge protection is formed in an edge region on the surface between the integrated circuit and the outer edge of the semiconductor chip.

Provision is made of a method for producing a semiconductor arrangement, in which an integrated circuit is formed on one surface of a semiconductor chip, a metallic layer which comprises a plurality of partial regions and does not completely cover the surface of the semiconductor chip is applied to the surface, at least one contact element is formed and is electrically conductively connected to one of the partial regions, and edge protection is formed in an edge region on the surface between the integrated circuit and the outer edge of the semiconductor chip.

Figure 1:
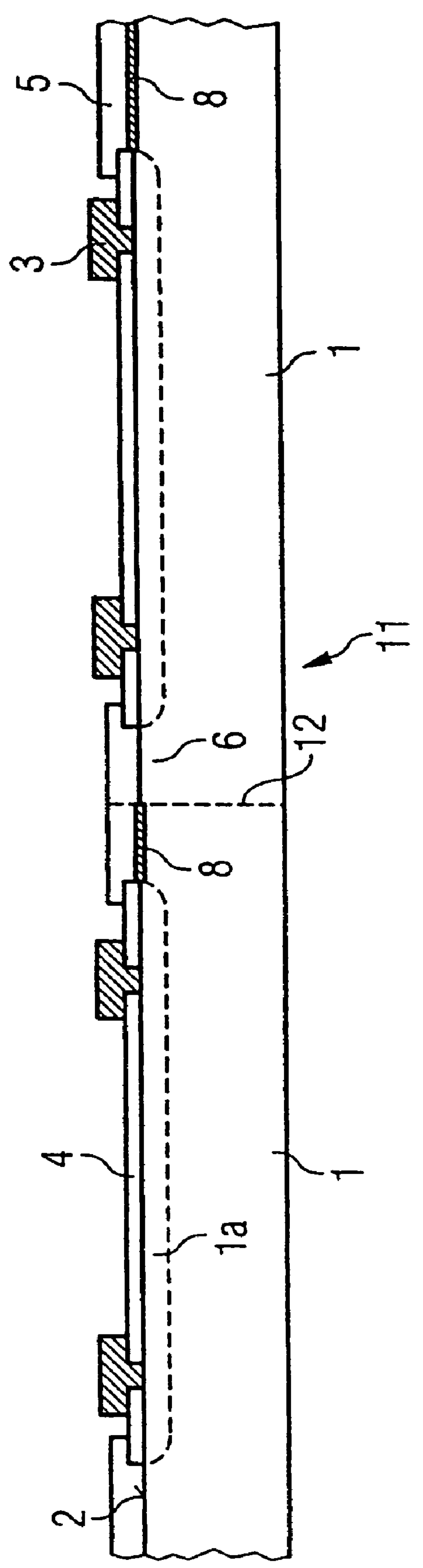
FIG. 1 shows a first exemplary embodiment of a semiconductor arrangement before singulation from a wafer.

FIG. 1 shows part of a semiconductor wafer 11 which is composed of a multiplicity of individual semiconductor chips 1. The latter are jointly produced on the semiconductor chip in a multiplicity of process steps such that the integrated circuits 1*a* indicated in FIG. 1 are formed. Since these integrated circuits, which may also be an individual transistor or an individual diode in the "extreme case", need to be provided with contacts in order to be used, contact regions are formed on the surface. This may be, for example, a thin nickel layer. In many cases, metallic structures are also formed on the surface of the semiconductor chip 1 outside the integrated circuit for various reasons. Such a metallic structure 8 which, in the rarest cases, completely covers the edge region outside the integrated circuit on the surface of the semiconductor chip is indicated by the thicker line 8. Since the integrated circuits are very sensitive to external influences on account of the fine structures, the integrated circuit is generally covered by a so-called chip passivation 4 or passivation layer. This is, for example, a nitride or else a polyimide.

In order to actually contact-connect the integrated circuit 1*a*, an opening is now formed in the passivation layer 4 wherever contact areas are formed in the integrated circuit. So-called wire bonding connections were generally previously formed in these contact areas but it is increasingly customary nowadays, on account of the faster method sequence, to provide so-called contact bumps or contact elements 3 which can be used to produce so-called flip-chip connections.

The latter are formed, for example, by depositing nickel or a nickel/gold alloy without using electric current. A wafer 11 which has been prepared in this manner for mounting would be separated into individual chips 1, as shown in FIG. 1, by means of sawing along a sawing line 12, for example. In actual fact, however, an extended passivation which forms edge protection 5 is applied in the region between the integrated circuits 1*a* on the chip surface 2, in accordance with the exemplary embodiment shown in FIG. 1.

In accordance with the exemplary embodiment illustrated in FIG. 1, this additional passivation which forms the edge protection 5 is composed of a photoimide or a polyimide, now projects beyond the chip passivation 4 and is also formed on the chip passivation in the adjoining region. The result is, as it were, an overlap. Applying the additional passivation 5 or forming the edge protection 5 now makes it possible to saw along the sawing line 12 without any problems even if metallic structures 8 (as previously mentioned) are formed in this region.

Figure 2:
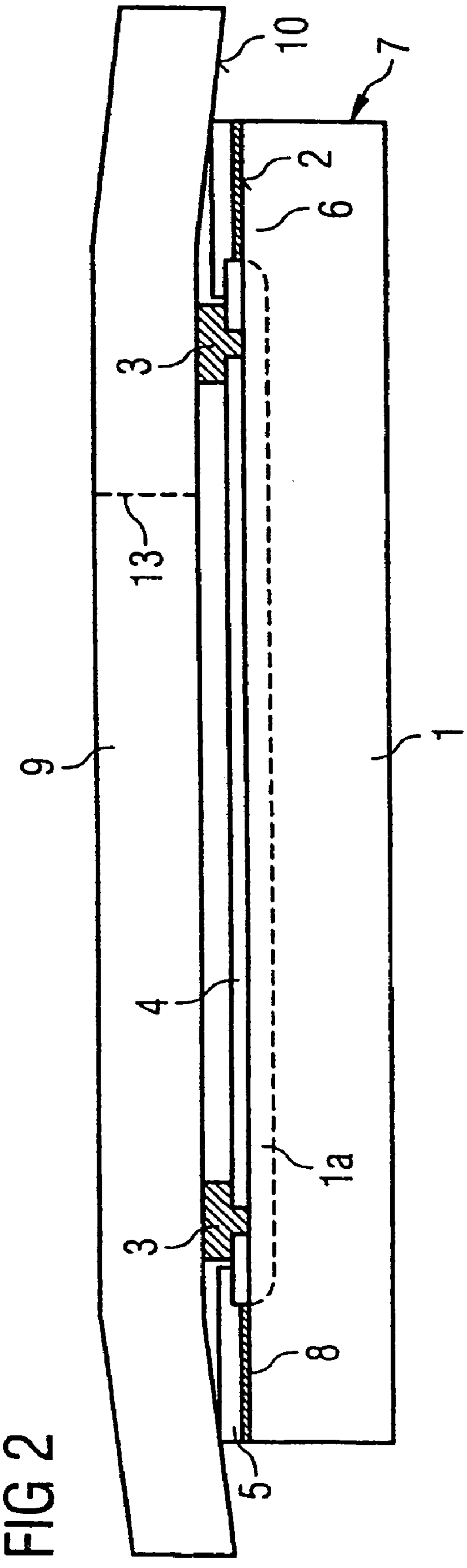
FIG. 2 shows the first exemplary embodiment, after singulation, together with a substrate.

A semiconductor chip formed in this manner can now be mounted together with a substrate, as is illustrated, for example, in FIG. 2. In this illustration, as well as in all of the other illustrations, the same reference symbols denote the same objects, as a result of which repetitions in the description can be dispensed with for the purpose of simplification and shortening. As shown in FIG. 2, the semiconductor chip 1 has now been applied to a substrate 9, and the substrate 9 is made from a flexible material and can bend during the mounting operation. As a result of the bending, that surface 10 of the substrate 9 which faces the semiconductor chip 1 comes to rest on the edge protection 5. Since the latter is made from an insulating material, short circuits or disturbances which are caused by the conductive surface or conductive structures on the surface 10 are prevented. In this case, the substrate 9 may be composed of a flexible plastic which has conductive structures for contact-connection on the surface 10. However, the substrate 9 may equally be composed of metal in the form of a thin plate of a so-called "leadframe". In the case of a leadframe, an interruption 13 would be provided at a suitable place (indicated by the dotted line) in the substrate if an electrically conductive connection is not desired between the left-hand contact and the right-hand contact 3 via the substrate 9 in the form of a leadframe.

Figure 3:
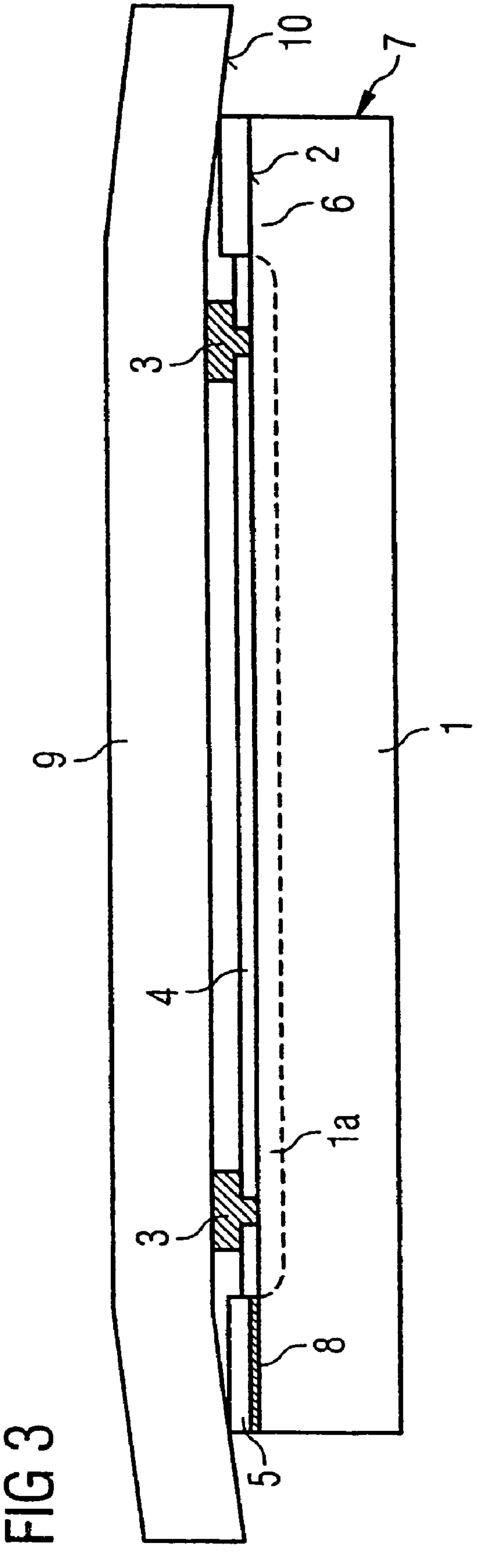
FIG. 3 shows a modification of the arrangement which is illustrated in FIG. 2.

The arrangement shown in FIG. 3 is essentially the same as that in FIG. 2 and also has a substrate 9 in the form of a leadframe or in the form of a plastic carrier having conductive structures on the surface. The only difference between the arrangement shown in FIG. 3 and the arrangement shown in FIG. 2 is that the edge protection 5 and the chip passivation 4 do not overlap.

Figure 4:
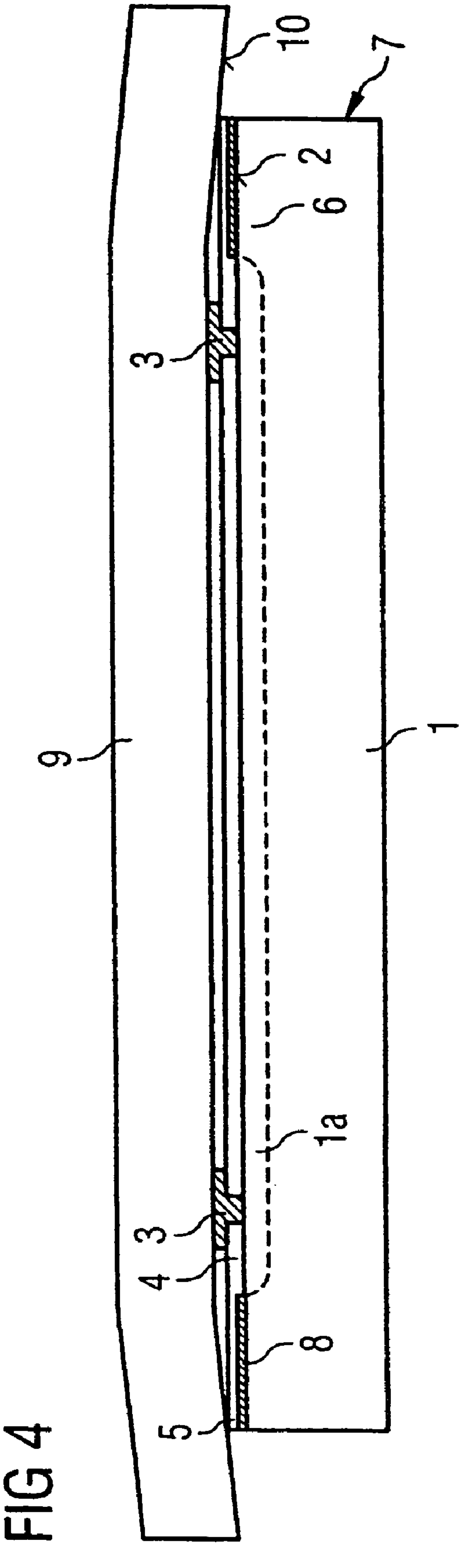
FIG. 4 shows a second exemplary embodiment.
Figure 5:
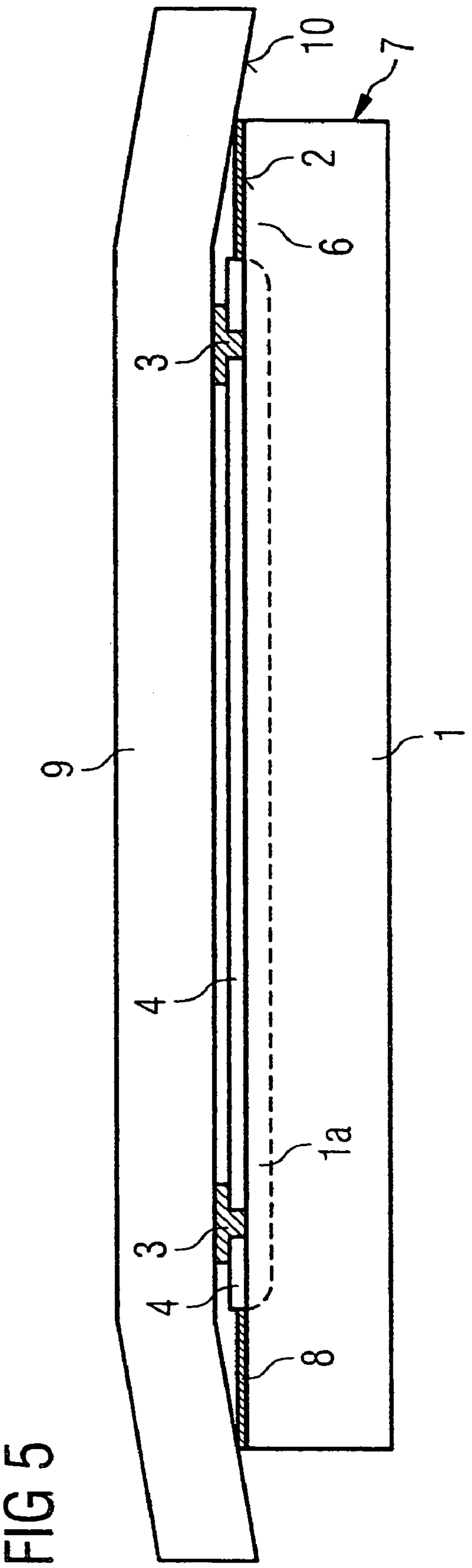
FIG. 5 shows a conventional arrangement.

FIG. 4 illustrates a special refinement. In this exemplary embodiment, the edge protection 5 is produced by virtue of the chip passivation 4 extending into the edge region. This means that the chip passivation 4 also covers the surface 2 of the semiconductor chip 1 outside the region of the integrated circuit 1*a*. It extends as far as the outer edge 7 of the semiconductor chip 1. As described, bending of the substrate 9, irrespective of whether it is a leadframe or a plastic carrier having conductive structures on the surface, does not result in undesirable effects in this case either.

It shall be pointed out that the semiconductor arrangements described are particularly suited to use in chip modules which are to be used in chip cards. In this case, however, the invention is not restricted to cards in credit card format but rather may be used in all other configurations, for example the known SIM cards, and in the mass memories (which are known under the term "multimedia card") for storing music or image or video data, for example. It shall be pointed out that external contacts of the chip module are provided where used for a chip card if the latter is a contact-type chip card. This means that conductive structures, i.e. contacts, which are connected to the conductive structures on the surface 10 are likewise formed on the surface of the substrate 9 which faces away from the semiconductor chip 1. The conductive structures are not described for the sake of simplicity since they would not assist the explanation of the invention. If the substrate 9 is in the form of a leadframe, the surface of the substrate 9 is, of course, also conductive per se.

In the case of the measures described, particularly as a result of the provision of edge protection on the surface of the semiconductor chip in an edge region, the substrate is prevented from directly resting on the surface of the semiconductor chip. In particular, this can be advantageously achieved by virtue of the chip passivation which usually covers the region of the integrated circuit for the purpose of protecting the latter extending into the edge region. If the chip passivation extends over the entire edge region, this measure is particularly reliable. As a result of the passivation layer (which is generally in the form of a polyimide or photoimide) being used and extending in the edge region, this step is not associated with any additional production step which increases the production costs.

If the edge protection is not applied at the same time as the passivation layer, this measure has the advantage that the edge protection can be applied at a suitable point in time, for example in a so-called "back-end line" just shortly before mounting. This measure also has the advantage that, in the case of "front-end lines" in which there is no provision for the passivation layer to extend into the edge region, edge protection of this type can nevertheless be produced. In particular, the application of edge protection which projects beyond the passivation layer and overlaps the latter ensures particularly reliable protection since, when singulating the semiconductor chips from the wafer (so-called "dicing"), the protective layer may be broken off and flaked away at the edge, and the elevation, in particular, results in the surface of the semiconductor chip being reliably prevented from being placed on the substrate in the edge region. The fact that the edge protection is applied, partially or completely, over the edge region is simultaneously associated with the advantage that any type of metallization is covered. This has the advantage that, in order to test the integrated circuits on the wafer, test contacts which are covered by the edge protection can be arranged, for example, in the region of the so-called "scribing frame" or "sawing frame", as a result of which it is possible to prevent incorrect behavior or manipulation of the chip during actual operation. If a semiconductor chip which has been provided with edge protection of this type is arranged on a substrate, there is a reliable arrangement irrespective of whether the substrate is provided in the form of a flexible plastic carrier with conductive structures formed on the latter or the substrate is formed, overall, from a metallic material and thus forms a so-called "leadframe". In these leadframe arrangements, the entire substrate area is fabricated from a thin metal sheet and is divided into individual conductive regions which are electrically separated by spacings. The regions are first of all connected via webs for sufficient mechanical stability during the production method. As soon as the semiconductor chip has been applied to this leadframe and has been electrically conductively contact-connected, these webs are removed, so that the individual line areas are electrically insulated. This measure is carried out as late as possible in the production method.

It is self-evident and easily apparent that all of the individual aspects of the edge protection can be combined with the possible configurations of the substrate and semiconductor chip. Neither the scope nor the significance of the possible combinations is restricted to the sequences and points of view specified in the patent claims.

It is also found to be particularly advantageous if, when producing a semiconductor arrangement, an integrated circuit is formed on one surface of a semiconductor chip, a metallic layer which comprises a plurality of partial regions and does not completely cover the surface of the semiconductor chip is then applied to the surface, a passivation layer having at least one opening is then applied over the integrated circuit, a contact element which projects beyond the passivation layer and is electrically conductively connected to one of the partial regions comprising the metallic layer is formed through the opening, and edge protection is formed at least in the edge region on the surface between the integrated circuit and an outer edge on the surface of the semiconductor chip. In this case, it is particularly advantageous if the edge protection is formed in the region of the sawing track or the scribing frame on the wafer which is composed of a multiplicity of semiconductor chips, so that this measure is simultaneously developed in one process step for all semiconductor chips. It also has the advantage that bad experience was had with sawing metallic structures which were formed on the wafer surface and were left behind. The specified method makes it possible to prevent metallic structures from being charged in the region of the sawing track or scribing frame. Applying the edge protection in the region of the sawing track after the passivation layer which reflects the integrated circuit has been formed has the advantage that use may be made of conventional systems which, although providing a passivation, make it inconvenient to extend this passivation layer into the region of the scribing frame or sawing track.

In the case of the production method which was described by way of example as well, neither the scope nor the significance, in accordance with the order of the points of view expounded, of said method is restricted to the individual aspects expounded. Other combinations are also easily apparently possible and do not relate to the combinations already explained.

What is claimed as new and desired to be protected by Letters Patent of the United States is:

1. A semiconductor arrangement comprising:

at least one semiconductor chip which has on one surface an integrated circuit and at least one contact element which is electrically conductively connected to the integrated circuit;

a layer arranged on the one surface, which layer covers the integrated circuit and through which layer the at least one contact element projects;

a metallic layer arranged on an edge region of the one surface of the semiconductor chip; and an edge protector which completely covers the metallic layer on the edge region of the one surface of the semiconductor chip, the edge region extending along outer edges of the semiconductor chip, wherein the edge protector arranged on the one surface projects, parallel to the one surface, beyond the layer towards the outer edge of the semiconductor chip, and wherein the edge protector partially overlaps with the layer in an adjoining region.

2. The semiconductor arrangement as claimed in claim 1, wherein the edge region is not occupied by the integrated circuit and extends between the integrated circuit and the nearest outer edge.

3. The semiconductor arrangement as claimed in claim 1 wherein the edge protector is made of an insulating material.

4. The semiconductor arrangement as claimed in claim 2, wherein the layer completely extends to the outer edge of the semiconductor chip.

5. The semiconductor arrangement as claimed in claim 3, wherein the layer acts as a passivation layer and is formed using a polyimide.

6. The semiconductor arrangement as claimed in claim 1, wherein the edge protector is distinct from the layer.

7. The semiconductor arrangement as claimed in claim 1, wherein the edge protector at least partially covers the layer in an adjoining region.

8. The semiconductor arrangement as claimed in claim 1, further comprising a metallic layer which is at least partially covered by the edge protector.

9. The semiconductor arrangement as claimed in claim 8, further comprising a metallic layer which is completely covered by the edge protector.

10. The semiconductor arrangement as claimed in claim 1, further comprising:

a substrate on which the at least one contact element of the semiconductor chip is placed, wherein the substrate has a surface which faces the semiconductor chip and has electrically conductive regions.

11. The semiconductor arrangement as claimed in claim 10, wherein the substrate comprises a flexible plastic carrier, and at least the surface which faces the semiconductor chip is provided with a conductive structure.

12. The semiconductor arrangement as claimed in claim 10, wherein the substrate comprises a conductive material.

13. A semiconductor arrangement comprising:

a semiconductor chip which has an integrated circuit on one surface, and a contact element which is arranged on the one surface and is connected to a substrate that comprises a flexible material;

a metallic layer arranged on an edge region of the one surface of the semiconductor chip; and an edge protector which completely covers the metallic region in such a manner that the substrate on an outer edge of the semiconductor chip comes to rest on the edge protector in the event of bending of the substrate;

wherein on the one surface of the semiconductor chip, the edge protector is arranged laterally outside the integrated circuit by the outer edge of the semiconductor chip and on an adjoining region, and wherein the integrated circuit is only partially overlapped by the edge protector.

14. The semiconductor arrangement as claimed in claim 13, further comprising a layer which covers the integrated circuit and through which the at least one contact element projects.

15. The semiconductor arrangement as claimed in claim 14, wherein the layer is a passivation layer.

16. The semiconductor arrangement as claimed in claim 15, wherein the passivation layer is formed of a polyimide.

17. The semiconductor arrangement as claimed in claim 16, wherein the edge protector is distinct from the passivation layer.

18. The semiconductor arrangement as claimed in claim 17, wherein the edge protector projects beyond the passivation layer.

19. The semiconductor arrangement as claimed in claim 18, in which the edge protector at least partially covers the layer in the adjoining region.

20. The semiconductor arrangement as claimed in claim 13, wherein the metallic layer in the edge region is completely covered by the edge protector.

21. The semiconductor arrangement as claimed in claim 13, wherein the substrate has a surface which faces the semiconductor chip and has electrically conductive regions.

22. The semiconductor arrangement as claimed in claim 21, wherein the substrate comprises a flexible plastic carrier, and at least the surface which faces the semiconductor chip is provided with a conductive structure.

23. The semiconductor arrangement as claimed in claim 21, wherein the substrate comprises a conductive material.

* * * * *